US012689294B2

(12) United States Patent
Sinow

(10) Patent No.: US 12,689,294 B2
(45) Date of Patent: Jul. 21, 2026

(54) SYNCHRONOUS BOOST CIRCUITS WITH ENHANCED ZERO VOLTAGE SWITCHING AND METHODS FOR OPERATING THE SAME

(71) Applicant: Navitas Semiconductor Limited, Dublin (IE)

(72) Inventor: Victor Sinow, Fresno, CA (US)

(73) Assignee: Navitas Semiconductor Limited, Dublin (IE)

( * ) Notice: Subject to any disclaimer, the term of this patent is extended or adjusted under 35 U.S.C. 154(b) by 206 days.

(21) Appl. No.: 18/762,523

(22) Filed: Jul. 2, 2024

(65) Prior Publication Data

US 2025/0055371 A1      Feb. 13, 2025

Related U.S. Application Data

(60) Provisional application No. 63/518,499, filed on Aug. 9, 2023.

(51) Int. Cl.
| | |
|---|---|
| *H02M 3/158* | (2006.01) |
| *H02M 1/00* | (2006.01) |
| *H02M 3/155* | (2006.01) |
| *H02M 3/156* | (2006.01) |
| *H02M 3/157* | (2006.01) |
| *H03K 17/687* | (2006.01) |

(52) U.S. Cl.
CPC ......... *H02M 3/158* (2013.01); *H02M 1/0009* (2021.05); *H02M 1/0058* (2021.05); *H03K 17/6871* (2013.01); *H02M 3/155* (2013.01); *H02M 3/156* (2013.01); *H02M 3/157* (2013.01); *H03K 2217/0063* (2013.01); *H03K 2217/0072* (2013.01); *H03K 2217/0081* (2013.01)

(58) Field of Classification Search
CPC ............................................. H02M 3/155–158
See application file for complete search history.

(56) References Cited

U.S. PATENT DOCUMENTS

| | | | |
|---|---|---|---|
| 2015/0171855 A1* | 6/2015 | Braun .................. | H03K 17/284 327/384 |
| 2017/0366080 A1* | 12/2017 | Chang .................. | H02M 1/088 |
| 2019/0097542 A1* | 3/2019 | Op Het Veld ...... | H02M 3/3378 |

* cited by examiner

*Primary Examiner* — Gary A Nash
(74) *Attorney, Agent, or Firm* — FisherBroyles, LLP

(57) ABSTRACT

A method of operating a circuit is disclosed. The method includes providing an input terminal and a ground terminal coupled to a power supply, providing an output terminal and the ground terminal coupled to a load, providing a low-side circuit comprising a low-side power switch coupled between a switch node and the ground terminal, providing a high-side circuit comprising a high-side power switch coupled between the switch node and the output terminal, providing an inductor coupled between the switch node and the input terminal, detecting, by a controller, a valley of a voltage at the switch node, transmitting a signal, by the low-side circuit, to the high-side circuit in response to the controller detecting the valley, and turning on, by the high-side circuit, the high-side power switch for a time interval sufficient to generate a negative current in the inductor in response to receiving the signal.

20 Claims, 9 Drawing Sheets

*800*

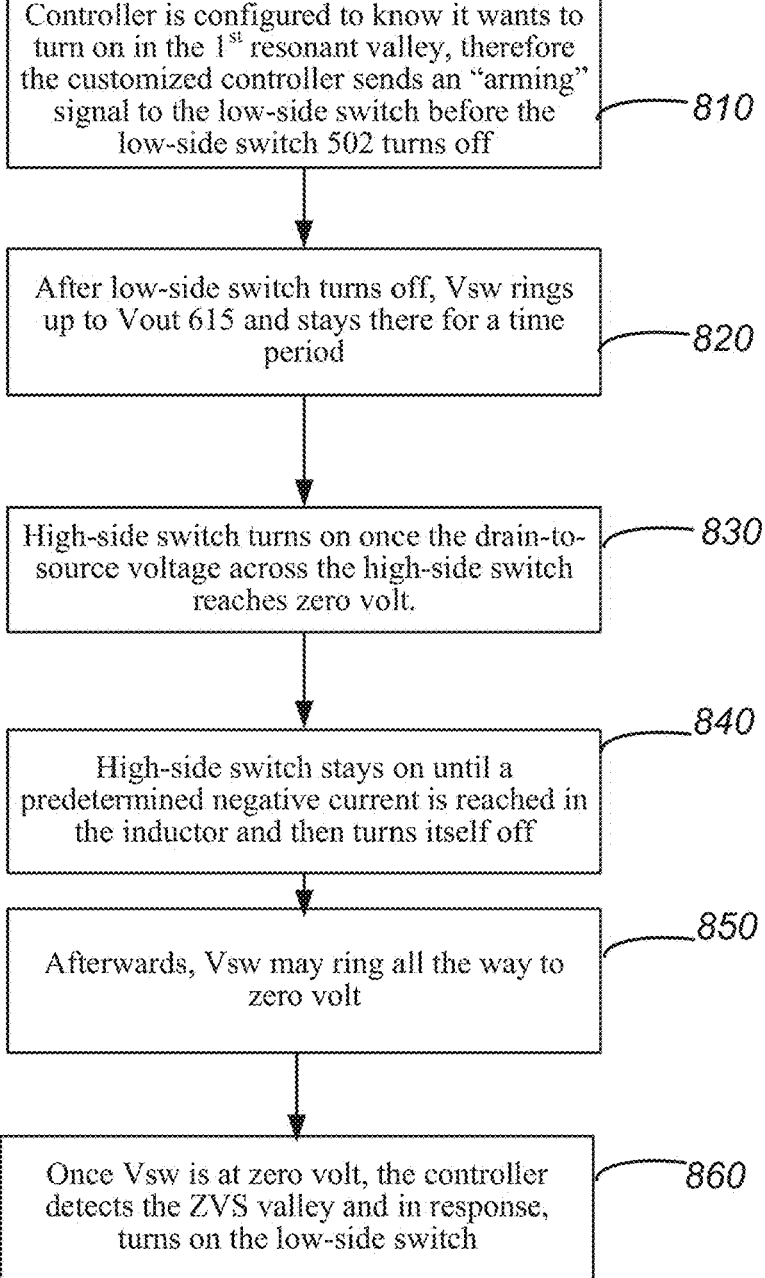

Controller is configured to know it wants to turn on in the 1$^{st}$ resonant valley, therefore the customized controller sends an "arming" signal to the low-side switch before the low-side switch 502 turns off ⟶ *810*

After low-side switch turns off, Vsw rings up to Vout 615 and stays there for a time period ⟶ *820*

High-side switch turns on once the drain-to-source voltage across the high-side switch reaches zero volt. ⟶ *830*

High-side switch stays on until a predetermined negative current is reached in the inductor and then turns itself off ⟶ *840*

Afterwards, Vsw may ring all the way to zero volt ⟶ *850*

Once Vsw is at zero volt, the controller detects the ZVS valley and in response, turns on the low-side switch ⟶ *860*

FIG. 8

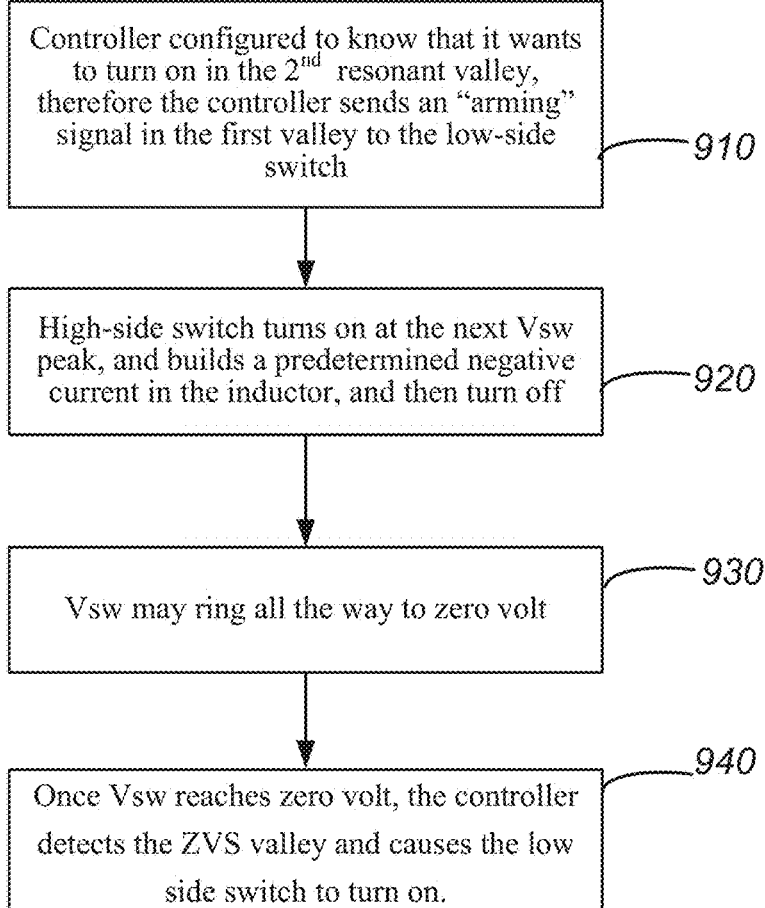

900

Controller configured to know that it wants to turn on in the 2$^{nd}$ resonant valley, therefore the controller sends an "arming" signal in the first valley to the low-side switch — 910

High-side switch turns on at the next Vsw peak, and builds a predetermined negative current in the inductor, and then turn off — 920

Vsw may ring all the way to zero volt — 930

Once Vsw reaches zero volt, the controller detects the ZVS valley and causes the low side switch to turn on. — 940

FIG. 9

SYNCHRONOUS BOOST CIRCUITS WITH ENHANCED ZERO VOLTAGE SWITCHING AND METHODS FOR OPERATING THE SAME

CROSS REFERENCE TO RELATED APPLICATIONS

This application claims priority to U.S. provisional patent application Ser. No. 63/518,499, for "Synchronous Boost Circuits with Enhanced Zero Voltage Switching" filed on Aug. 9, 2023, which is hereby incorporated by reference in entirety for all purposes.

FIELD

The described embodiments relate generally to power converters, and more particularly, the present embodiments relate to methods and techniques using enhanced zero voltage switching for improving efficiency of the power converter.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a circuit is disclosed. The circuit includes an input terminal and a ground terminal coupled to a power supply; an output terminal and the ground terminal coupled to a load; a low-side circuit having a low-side power switch coupled between a switch node and the ground terminal; a high-side circuit having a high-side power switch coupled between the switch node and the output terminal; an inductor coupled between the switch node and the input terminal; and a controller arranged to detect a valley of a voltage at the switch node; where in response to detecting the valley, the low-side circuit transmits a signal to the high-side circuit; where in response to receiving the signal, the high-side circuit turns on the high-side power switch for a time interval sufficient to generate a negative current in the inductor, and then turns off the high-side power switch causing the voltage at the switch node to transition to zero volts; and where the low-side circuit is arranged to turn on the low-side power switch in response to the voltage at the switch node at zero volts.

In some embodiments, the high-side circuit determines the time interval sufficient to generate a negative current in the inductor based on a duty cycle of a pulse width modulated (PWM) signal received from the controller, and a value of a resistor.

In some embodiments, the low-side circuit further includes a first current sense device arranged to transmit a first signal including at least one of a magnitude and polarity of a first current through the low-side power switch, and a first driver circuit arranged to transmit a first control signal to the low-side power switch based at least in part on a voltage at the switch node and the first signal.

In some embodiments, the first driver circuit includes a first threshold generation circuit.

In some embodiments, the low-side power switch is a gallium nitride (GaN) based switch.

In some embodiments, the high-side power switch is a gallium nitride (GaN) based switch.

In some embodiments, a method of operating a circuit is disclosed. The method includes providing an input terminal and a ground terminal coupled to a power supply; providing an output terminal and the ground terminal coupled to a load; providing a low-side circuit having a low-side power switch coupled between a switch node and the ground terminal; providing a high-side circuit having a high-side power switch coupled between the switch node and the output terminal; providing an inductor coupled between the switch node and the input terminal; detecting, by a controller, a valley of a voltage at the switch node; transmitting a signal, by the low-side circuit, to the high-side circuit in response to the controller detecting the valley; and turning on, by the high-side circuit, the high-side power switch for a time interval sufficient to generate a negative current in the inductor in response to receiving the signal.

In some embodiments, the method further includes turning off, by the high-side circuit, the high-side power switch causing the voltage at the switch node goes to zero volt.

In some embodiments, the method further includes turning on, by the low-side circuit, the low-side power switch in response to the voltage at the switch node being at zero volt.

In some embodiments, the method further includes determining, by the high-side circuit, the time interval sufficient to generate a negative current in the inductor based on a duty cycle of a pulse width modulated (PWM) signal received from the controller and a value of a resistor.

In some embodiments of the method, the low-side circuit includes a first current sense device.

In some embodiments, the method further includes transmitting, by the first current sense device, a first signal including at least one of a magnitude and polarity of a first current through the low-side power switch, and a first driver circuit arranged to transmit first control signals to the low-side power switch based at least in part on a voltage at the switch node and the first signal.

In some embodiments of the method, the low-side circuit further includes a first driver circuit.

In some embodiments, the method further includes transmitting, by the first driver circuit, a first control signal to the low-side power switch based at least in part on a voltage at the switch node and the first signal.

In some embodiments, a method of operating a circuit is disclosed. The method includes providing an input terminal and a ground terminal coupled to a power supply; providing an output terminal and the ground terminal coupled to a load; providing a low-side circuit having a low-side power switch coupled between a switch node and the ground terminal; providing a high-side circuit having a high-side power switch coupled between the switch node and the output terminal; providing an inductor coupled between the switch node and the input terminal; detecting, by a controller, a valley of a voltage at the switch node; transmitting a signal, by the low-side circuit, to the high-side circuit in response to the controller detecting the valley; turning on, by the high-side circuit, the high-side power switch for a time interval sufficient to generate a negative current in the inductor in response to receiving the signal or in response to receiving the signal and a drain-to-source voltage of the high-side power switch going to zero; turning off, by the high-side circuit, the high-side power switch causing the voltage at the switch node goes to zero volt; and turning on, by the low-side circuit, the low-side power switch in response to the voltage at the switch node being at zero volt.

BRIEF DESCRIPTION OF THE DRAWINGS

FIG. 8 is a simplified flowchart illustrating a method of operating a boost power converter in a critical conduction mode (CrCM) using a customized controller, according to some embodiments; and FIG. 9 is a simplified flowchart illustrating a method of operating a boost power converter in discontinuous conduction mode (DCM) using a customized controller, according to some embodiments.

DETAILED DESCRIPTION

Figure 1:
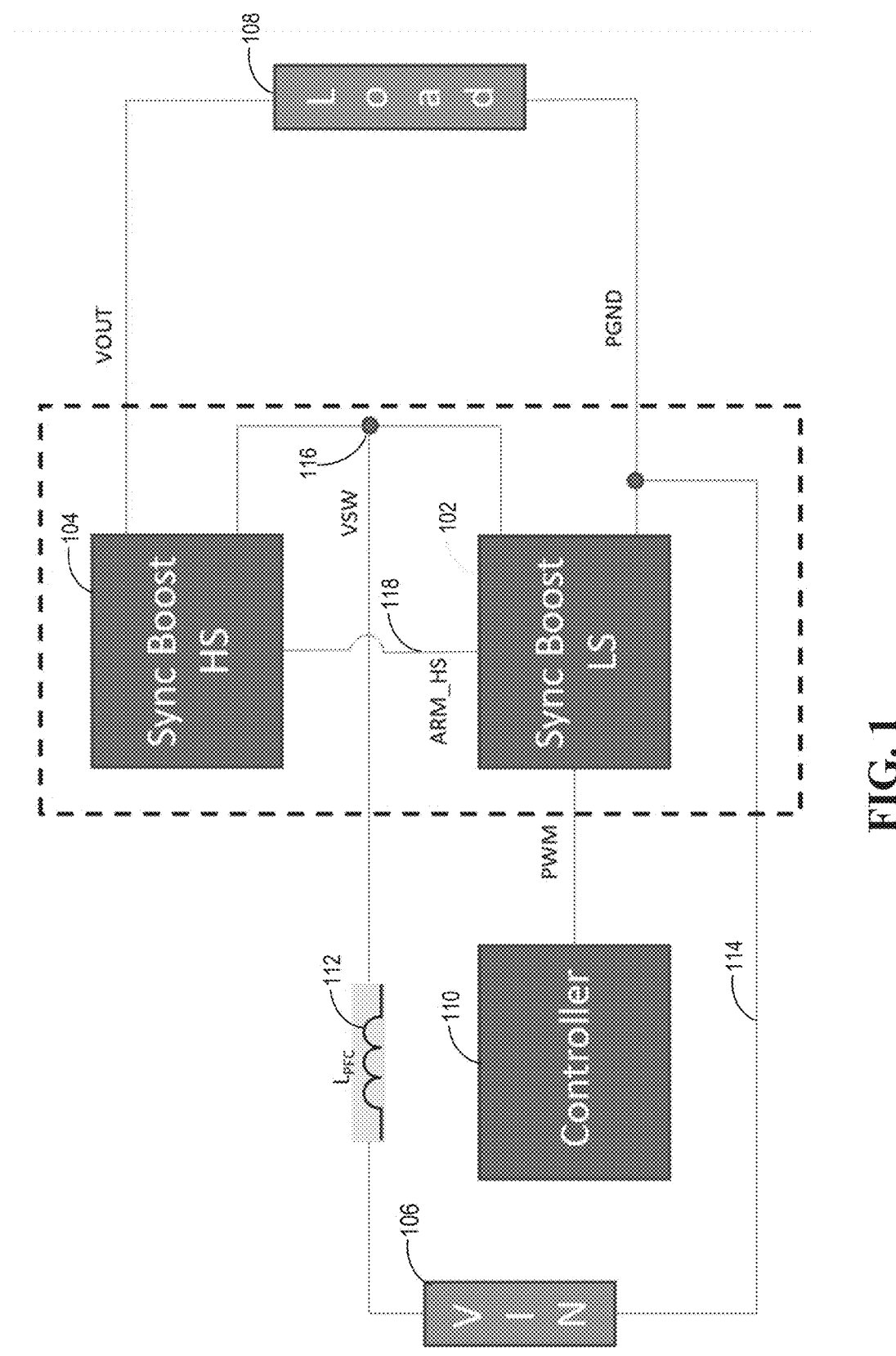
FIG. 1 illustrates a schematic of a synchronous boost power converter circuit receiving power from an input power supply and providing power to a load, according to some embodiments.

Circuits, devices and related techniques disclosed herein relate generally to power converters. More specifically, circuits, devices and related techniques disclosed herein relate to circuits and methods that employ intelligent power switches that can intercept pulse width modulated (PWM) signals from a controller in order to improve the timing of turn-on and/or turn-off of a synchronous boost high-side switch, thereby improving the efficiency of the power converter. In some embodiments, circuits and related techniques disclosed herein can be used in a boost power converter, such as, but not limited to, a power factor correction (PFC) circuit to improve its operational efficiency by enabling enhanced zero voltage switching (ZVS) of the power switches.

The enhanced ZVS technique may be performed, for example, in the following sequence: The low-side switch turns on thereby building current in the boost inductor (this is referred to as positive current where the current flows from the input voltage to the boost inductor). The low-side switch is then turned-off, causing the current in the boost inductor to flow through the high-side switch causing the switch node voltage Vsw to increase and achieve a steady state value while the current flows through the high-side switch. The Vsw may stay at the steady state value for a time period; when the high-side switch is turned off, the switch node may start to oscillate from the steady state value. Embodiments of the disclosure enable detecting the first resonant valley in the oscillations of the switch node voltage and in response to detecting the valley, turn-on the high-side switch for a time interval sufficient to generate a negative current in the inductor (negative current in the inductor is defined as a current that flows from the high-side switch to the boost inductor). In this way, sufficient energy is stored in the inductor such that upon turning-off of the high-side switch, the switch node voltage Vsw may swing all the way down to zero volt. Once Vsw is at zero, the low-side switch can be turned on.

In current approaches, a controller may attempt to turn on the low-side side at the first resonant valley of the Vsw ringing. Embodiments of the disclosure, enable functioning of the power switches with existing controllers, for example, by accepting the PWM signal from the controller when the Vsw voltage is at the first resonant valley, however the PWM signal from the controller is intercepted by the low-side switch and ignored, i.e., the low-side switch is not turned-on as commanded by the controller and the Vsw voltage is not brought to zero at the first resonant valley. Instead, the low-side switch can transmit an arming signal to the high-side switch informing the high-side switch to prepare for a turn-on. Subsequently, the Vsw voltage turns back up while it is ringing. Then, the high-side switch is turned-on for a brief time period at the next Vsw peak. In this way, sufficient amount of negative current is built up in the inductor.

The low-side switch may include a circuit that can detect the negative current. The built up of negative current in the boost inductor allows for storing of a relatively small amount of energy such that when the high-side switch is turned-off, the switch node has sufficient energy to go all the way down to zero. When Vsw reaches zero volt, embodiments of the disclosure cause the low-side switch to turn on. This control technique is referred to as controller interception method. The low-side switch intercepts the PWM signal from the controller and then manipulates the state of the power converter in such a way to turn-on and off the high-side switch in an optimally low-energy fashion.

In various embodiments, circuits and methods are disclosed for operating power converters that utilized gallium nitride (GaN) power switches and/or circuitry. In some embodiments, the power converters may utilize silicon-based power switches and/or circuitry. Various inventive embodiments are described herein, including methods, processes, systems, devices, and the like.

Several illustrative embodiments will now be described with respect to the accompanying drawings, which form a part hereof. The ensuing description provides embodiment (s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

FIG. 1 illustrates a schematic of a synchronous boost power converter circuit 100 receiving power from an input power (Vin) 106 and providing power to a load 108, according to some embodiments. The power converter circuit 100 can include a controller 110, an inductor 112, a low-side switch 102, and a high-side switch 104. The Vin 106 can be coupled between the inductor 112 and a ground node 114. The low-side switch 102 and high-side switch 104 can be coupled together at a switch node 116. The inductor 112 can be coupled between the switch node 116 and the Vin 106. The controller 110 may be coupled to the low-side switch 102. In some embodiments, the controller may be an off-the-shelf controller. In various embodiments, the controller may be a customized controller according to certain embodiments of the disclosure. The low-side switch 102 and the high-side switch 104 can have an additional connection 118. The additional connection 118 can be utilized by the low-side switch 102 to transmit signals to the high-side switch 104 and receive feedback signals from the high-side switch 104. The load 108 can be coupled between the high-side switch 104 and the ground node. Controller 110 can be configured to transmit pulse width modulated (PWM) signals to the low-side switch 102.

Figures 2A, 2B, 2C, 2D, 2E:
FIGS. 2A-2E illustrate an operation of the synchronous boost power converter circuit of FIG. 1, according to certain embodiments.

Now Referring to FIGS. 1 and 2A-2E, operation of the synchronous boost power converter circuit 100 is described, according to certain embodiments. This method operation of the power converter may be referred to as enhanced zero voltage switching (ZVS) technique. FIGS. 2A-2E show various node voltages as a function of time. In a first operation, the low-side switch can be turned on thereby building a current in the inductor 112 (this is referred to as positive current where the current flows from Vin 106 to the inductor 112). The low-side switch 102 is then turned-off, causing the current in the inductor 112 to flow through the high-side switch 104. As shown in FIG. 2A, this can cause the switch node voltage Vsw to increase and achieve a steady state value 215. The Vsw may stay at the steady state value for a time period. When the high-side switch 104 is turned off, the switch node voltage Vsw may start to oscillate from the steady state value. The low-side switch 102 can include circuits that can detect the voltage at the switch node. When the controller 110 detects a first resonant valley in the oscillations of Vsw, it may attempt to turn on the low-side switch 102 by transmitting a PWM on signal as shown in FIG. 2B at time position #1.

However, position #1 may not be the most optimal energy efficient position to turn on the low-side switch. Therefore, the low-side switch 102 in response to detecting the first resonant valley of Vsw, may transmit an arming signal to the high-side switch 104, as shown in FIG. 2C position #2, informing the high-side switch 104 to get ready for a turn-on. Subsequently, the high-side switch 104 may be turned on for a brief time interval, as shown in FIG. 2D position #3, sufficient to generate a negative current in the inductor 112 (negative current in the inductor is defined as a current that flows from the high-side switch to the boost inductor). In this way, sufficient energy is stored in the inductor such that upon turning-off of the high-side switch, the switch node voltage Vsw can swing all the way down to zero volt. After Vsw reaches zero volt, the low-side switch 102 can then be turned-on as shown in FIG. 2E. Thus, the switch node can be turned off not at the valley n intended by the controller 110, but instead at a next valley n+1 where it is relatively more energy efficient. In some embodiments, the turn off valley can be any valley such as n+2, or n+3, etc. This technique is performed by intercepting the PWM signal from the controller and manipulating the turn-on/off of the high-side switch in order to turn the high-side switch on such that the switch node has sufficient amount of energy stored be able to go all the way down to zero volt. This method may also be referred to as controller interception. The operational efficiency of the power convert can be increased by using of this method.

Figure 3:
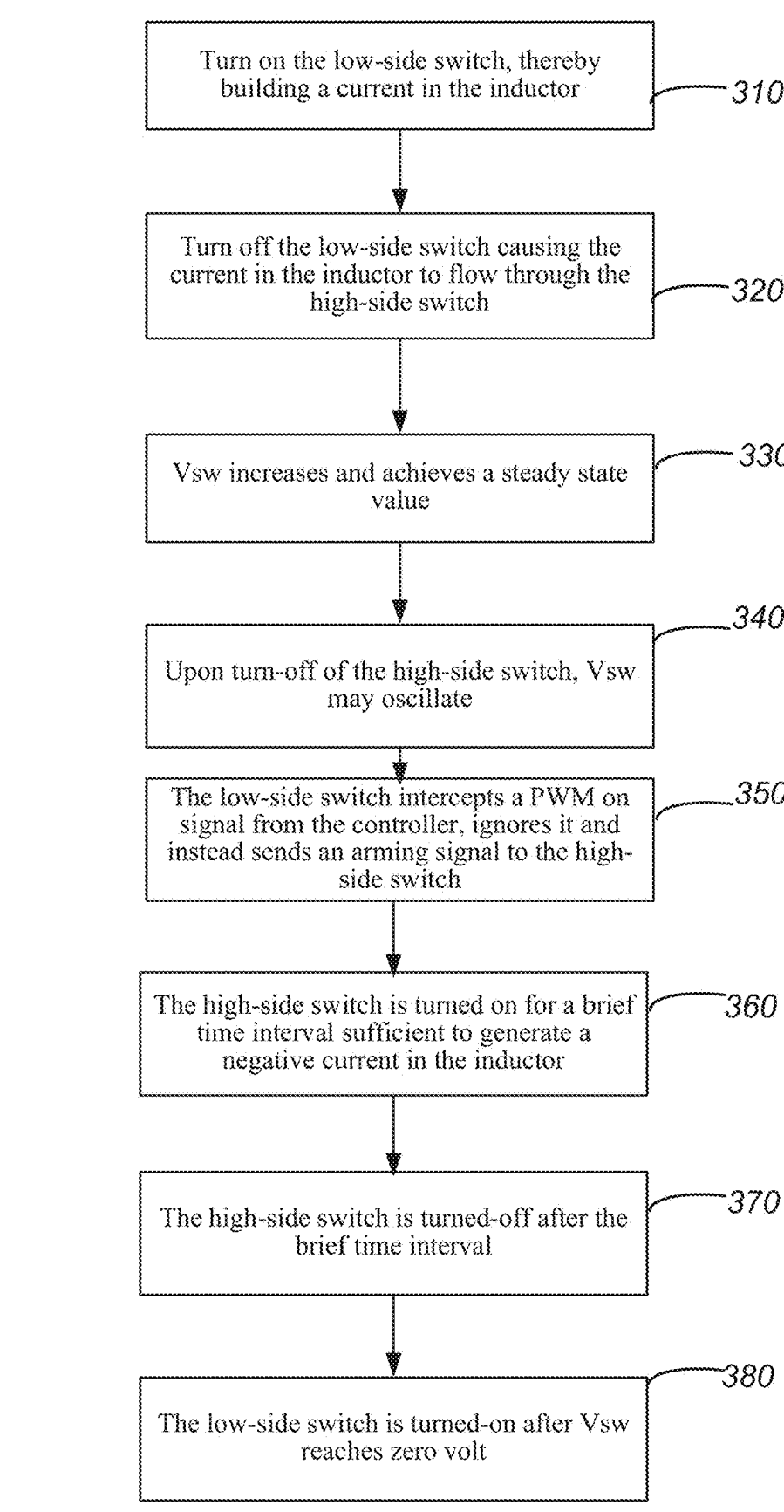
FIG. 3 is a simplified flowchart illustrating a controller interception method of operating a boost power converter, according to some embodiments.

FIG. 3 is a simplified flowchart illustrating a method 300 (controller interception) of operating a boost power converter, according to some embodiments. As illustrated in FIG. 3, the method 300 (controller interception) includes turning on turning on the low-side switch, thereby building a current in the inductor (310). The method also includes turning off the low-side switch causing the current in the inductor to flow through the high-side switch (320). Vsw increases and achieves a steady state value (330). Upon turn-off of the high-side switch, Vsw may oscillate (340). The low-side switch intercepts a PWM on signal from the controller, ignores it and instead sends an arming signal to the high-side switch (350). The high-side switch may wait until its VDS is equal to zero volts before it turns on. Subsequently, the high-side switch turns on for a brief time interval sufficient to generate a negative current in the inductor (360). In some embodiments, the high-side switch may turn on without waiting until its VDS is equal to zero. The high-side switch is turned-off after the brief time interval (370). The low-side switch is turned-on after Vsw reaches zero volt (380).

It should be appreciated that the specific steps illustrated in FIG. 3 provide a particular method of operating a boost power converter circuit according to an embodiment of the disclosure. Other sequences of steps may also be performed according to alternative embodiments. For example, alternative embodiments of the disclosure may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 4:
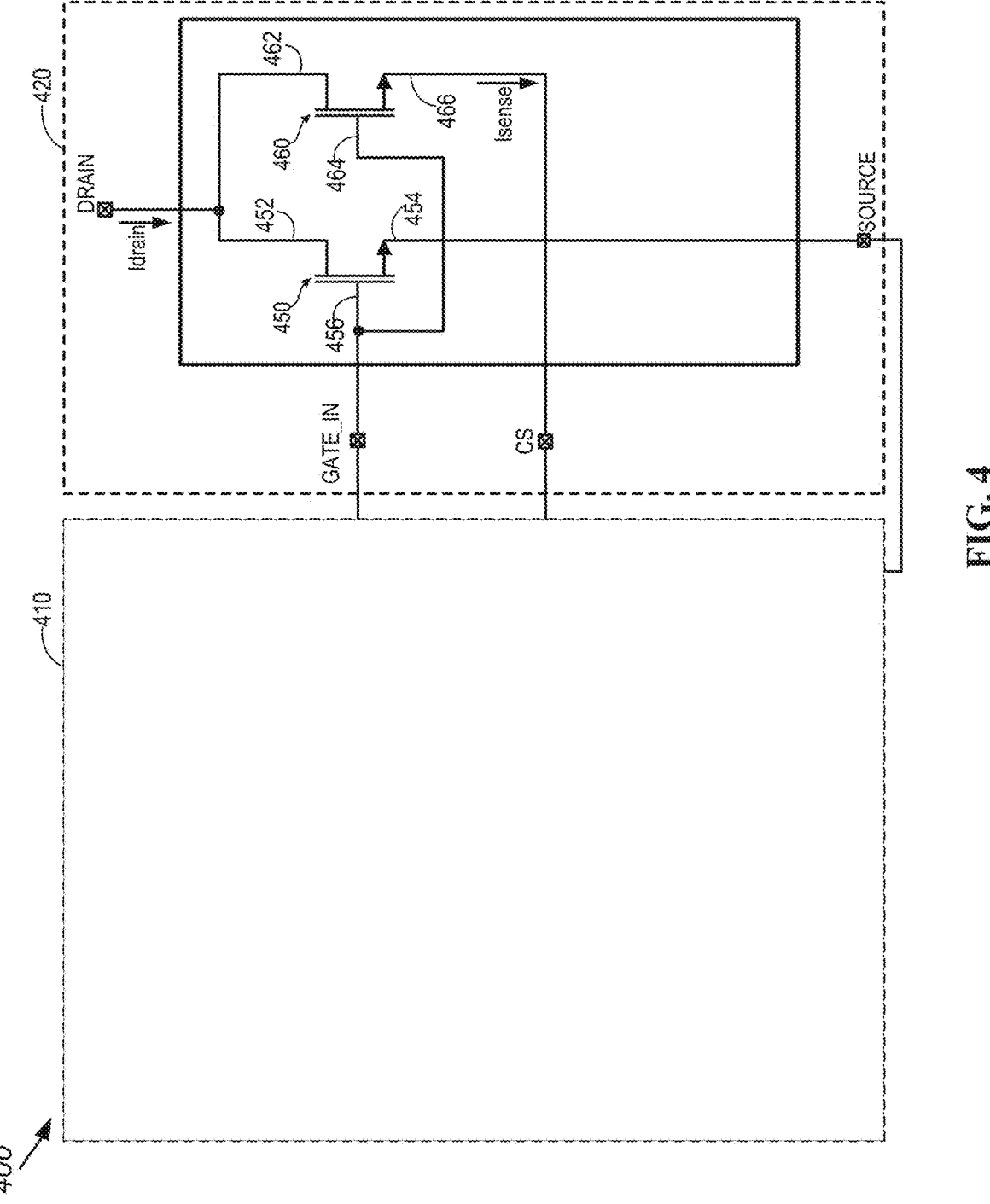
FIG. 4 illustrates a schematic of a composite switch that can be used for low-side and/or high-side switch in the power converter of FIG. 1, according to an embodiment of the disclosure.

The low-side switch may be configured to include circuits that can detect the resonant valleys of the switch node and in response send arming signals to the high-side switch. Both the low-side switch and the high-side switch may be configured to include sense devices that are able to detect a magnitude and polarity of current flow through the switches. FIG. 4 illustrates a schematic of a composite switch that can be used for low-side and/or high-side switch, according to an embodiment of the disclosure. Shown in FIG. 4 shows a composite switch 400 that can be used for the low-side switch and/or for the high-side switch. The composite switch can include a power switch and sensing circuit 420, and a logic circuit 410. The power switch and sensing circuit 420 may include a GaN power switch 450 having a drain terminal 452, a gate terminal 456 and a source terminal 454.

The power switch and sensing circuit 420 can further include a sense switch 460 coupled in parallel with the GaN power switch 450. The sense switch 460 can have a drain terminal 462, a gate terminal 464 and a source terminal 466. The sense switch 460 can be arranged to detect a magnitude and a polarity of a current flowing from drain terminal 452 to the source terminal 454. The sense switch 460 can further be arranged to transmit a first signal to the logic circuit 410 that includes information about the magnitude and the polarity of current flow in in the GaN power switch 450. The logic circuit 410 may be arranged to perform zero current detection and also arranged to receive and intercept a PWM signal from the controller 110.

Figure 5:
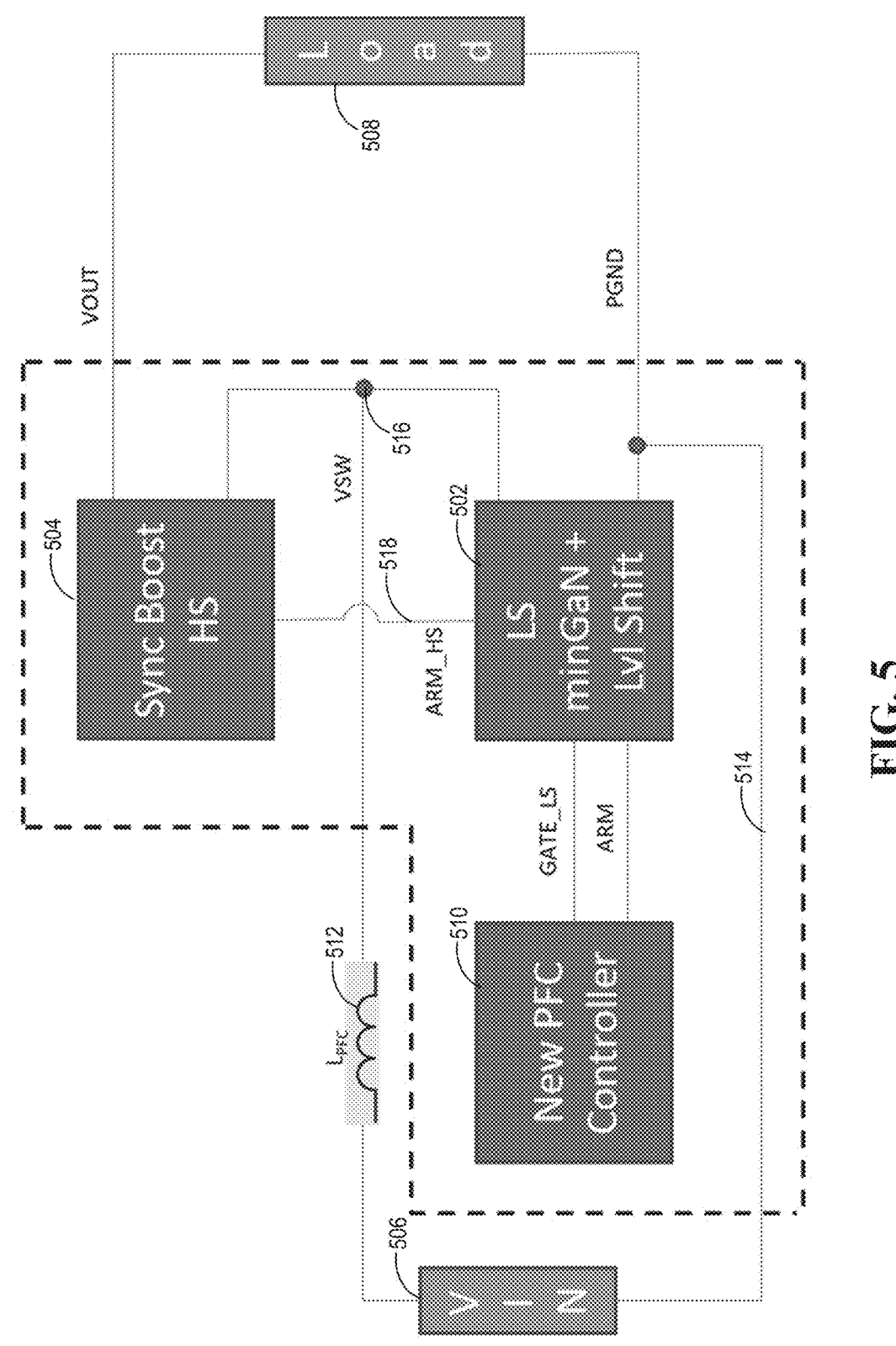
FIG. 5 illustrates a schematic of a synchronous boost power converter circuit utilizing a custom controller to perform enhanced zero voltage switching, according to some embodiments.

FIG. 5 illustrates a schematic of a synchronous boost power converter circuit 500 receiving power from an input power (Vin) 506 and providing power to a load 508, according to some embodiments. The power converter circuit 500 can include a controller 510, an inductor 512, a low-side switch 502, and a high-side switch 504. The controller 510 can be configured to be used for enhanced zero voltage switching (ZVS) in the power converter circuit 500. In some embodiments, the high-side switch 504, the low-side switch 502 and the controller 510 may be co-packaged in a unitary semiconductor package such as, but not limited to, a QFN package. In various embodiments, the controller 510 may be silicon based. In some embodiments, the controller 510 may be GaN-based. Vin 506 can be coupled between the inductor 512 and a ground node 514. The low-side switch 502 and high-side switch 504 can be coupled together at a switch node 516. The inductor 512 can be coupled between the switch node 516 and the Vin 506. The controller 510 may be coupled to the low-side switch 102 and arranged to transmit arming signals as well as control signals to the low-side switch 502. The low-side switch 502 and the high-side switch 504 can have an additional connection 518. The additional connection 518 can be utilized by the low-side switch 502 to transmit signals to the high-side switch 504 and receive feedback signals from the high-side switch 504. The load 508 can be coupled between the high-side switch 504 and the ground node.

Now Referring to FIGS. 5 and 6A-6D, operation of the synchronous boost power converter circuit 500 with a customized controller in a critical conduction mode (CrCM) is described, according to certain embodiments. The described operation may be for the power converter. The customized controller 510 enables use of enhanced zero voltage switching (ZVS) technique in the power converter. The customized controller 510 can generate an "arming" signal and drive a level shift FET on the composite low-side switch to pass that "arming" signal up to the high-side switch. The customized controller 510 can be configured to be able to determine which resonant valley to choose, so "arming" signal can be sent to ensure ZVS in the intended valley.

Figures 6A, 6B, 6C, 6D:
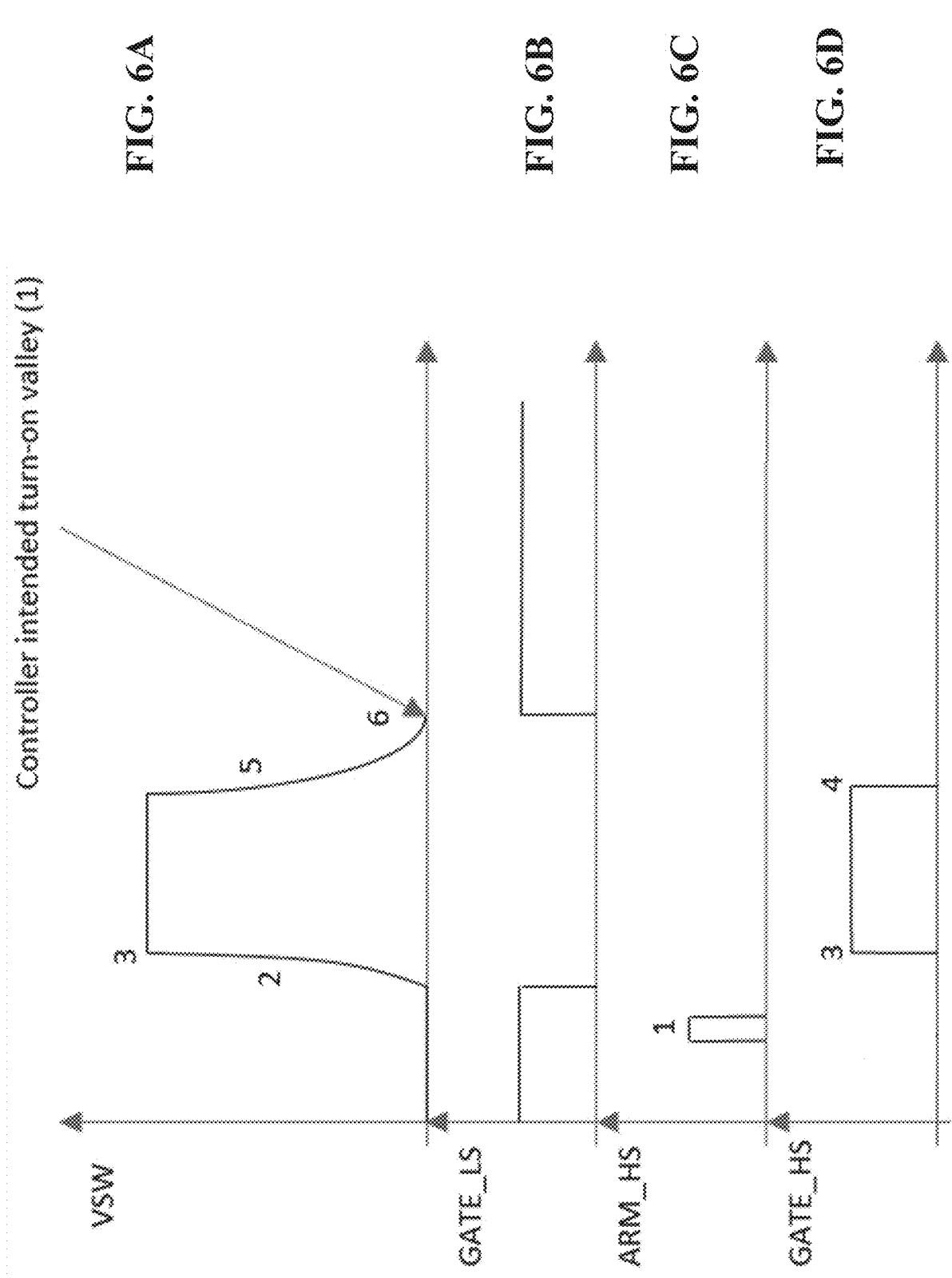
FIGS. 6A-6D illustrate operation of the synchronous boost power converter circuit of FIG. 5 in a critical conduction mode (CrCM), according to certain embodiments.

FIGS. 6A-6D show various node voltages as a function of time. The customized controller 510 can be configured to know it wants to turn on in the $1^{st}$ resonant valley, therefore the customized controller 510 may send an "arming" signal to the low-side switch 502 (indicated at position #1 in FIG. 6C) before the low-side switch 502 turns off, as shown in FIG. 6B. In some embodiments, the customized controller and the low-side switch may be integrated together on a unitary semiconductor chip, i.e., the customized controller's sending of the "arming" signal can be internal to the semiconductor chip. After low-side switch turns off, the switch node voltage Vsw rings up to (indicated by position #2 in FIG. 6A) Vout and stay there for a time period. Subsequently, the high-side switch 504 may turn on, as shown in FIG. 6D, once the drain-to-source voltage across the high-side switch 504 reaches zero volt. The high-side switch 504 may stay on until a predetermined negative current is reached in inductor 512 and then may turn itself off (indicated by position #4) as shown in FIG. 6D. Afterwards, Vsw may ring (indicated by position #5) all the way to zero volt (indicated by position #6). Once Vsw is at zero volt, the customized controller 510 can detect the ZVS valley and in response, turn on the low-side switch as shown in FIG. 6B.

Now Referring to FIGS. 5 and 7A-7D, operation of the synchronous boost power converter circuit 500 with a customized controller in a discontinuous conduction mode (DCM) is described, according to certain embodiments. The customized controller 510 can generate an "arming" signal and drive a level shift FET on the composite low-side switch to pass that "arming" signal up to the high-side switch. The customized controller 510 can be configured to be able to know which resonant valley to choose, so "arming" signal can be sent to ensure ZVS in the intended valley.

Figures 7A, 7B, 7C, 7D:
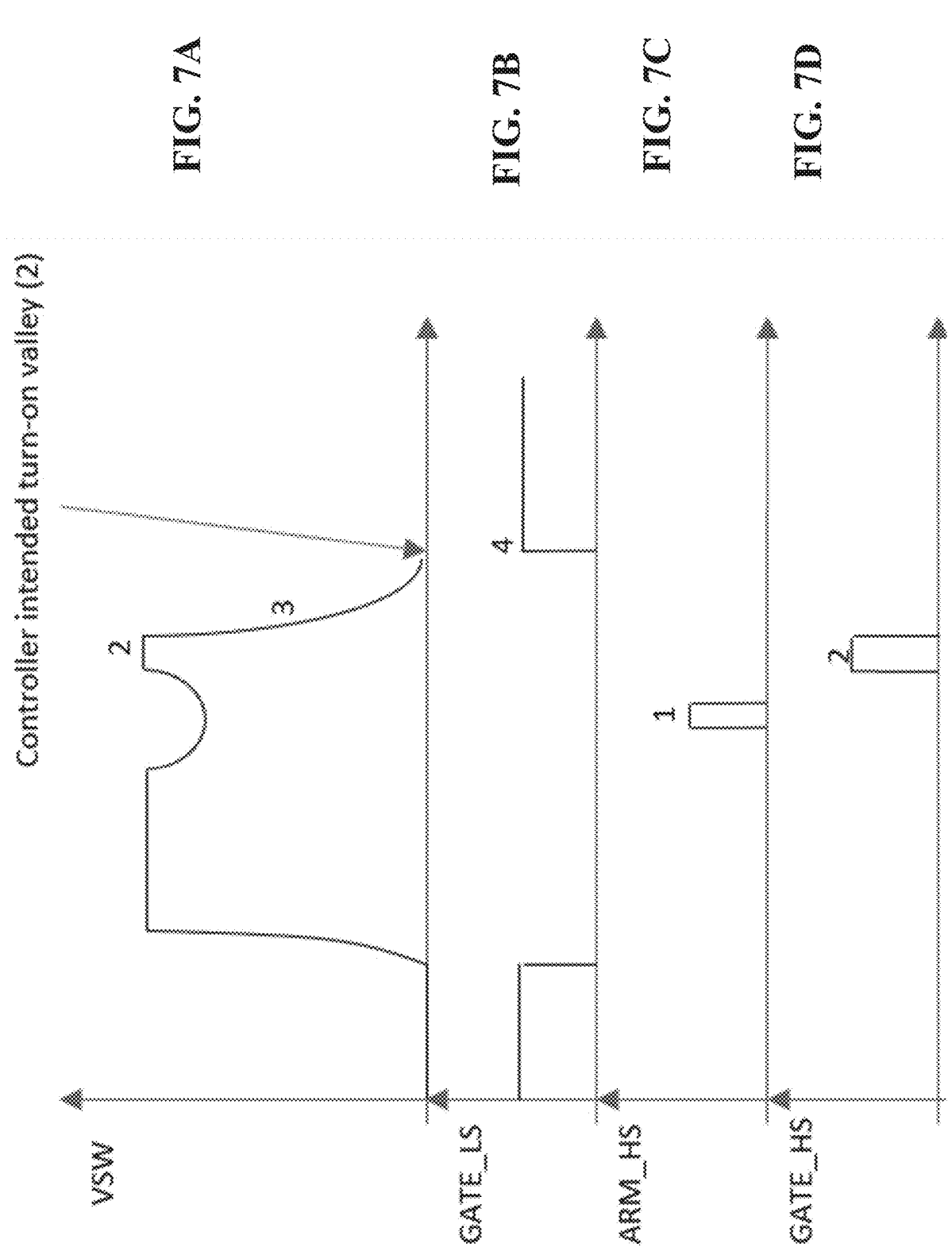
FIGS. 7A-7D illustrate operation of the synchronous boost power converter circuit of FIG. 5 in a discontinuous conduction mode (DCM), according to certain embodiments.

FIGS. 7A-7D show various node voltages as a function of time. The customized controller 510 can be configured to know that it wants to turn on in the $2^{nd}$ resonant valley, therefore the customized controller 510 may send an "arming" signal in the first valley to the low-side switch 502, as shown in FIG. 7C (indicated by position #1). The customized controller 510 can be configured to have valley detection capability. Subsequently, the high-side switch 504 can turn on at the next Vsw peak, and build a predetermined negative current in the inductor 512, and then turn off as shown in FIG. 7D (indicated by position #2). Subsequently, Vsw may ring all the way to zero volt as shown in FIG. 7A (indicated by position #3). Once Vsw reaches zero volt, the customized controller 510 may detect the ZVS valley and cause the low-side switch 502 to turn on, as shown in FIG. 7B.

FIG. 8 is a simplified flowchart illustrating a method 800 of operating a boost power converter in a critical conduction mode (CrCM) using a customized controller, according to some embodiments. As illustrated in FIG. 8, the method 800 includes sending an arming signal, by the customized controller, to the low-side switch before the low-side switch 502 turns off (810). After low-side switch turns off, Vsw rings up to Vout and stays there for a time period (820). High-side switch turns on once the drain-to-source voltage across the high-side switch reaches zero volt (830). High-side switch stays on until a predetermined negative current is reached in the inductor and then turns itself off (840). Afterwards, Vsw may ring all the way to zero volt (850). Once Vsw is at zero volt, the customized controller detects the ZVS valley and in response, turns on the low-side switch (860).

It should be appreciated that the specific steps illustrated in FIG. 8 provide a particular method of operating a boost power converter circuit according to an embodiment of the disclosure. Other sequences of steps may also be performed according to alternative embodiments. For example, alternative embodiments of the disclosure may perform the steps outlined above in a different order. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize many variations, modifications, and alternatives.

FIG. 9 is a simplified flowchart illustrating a method 900 of operating a boost power converter in discontinuous conduction mode (DCM) using a customized controller, according to some embodiments. As illustrated in FIG. 9, the method 900 includes sending an "arming" signal, by the controller, in the first valley to the low-side switch (910). Next, the high-side switch turns on at the next Vsw peak, and builds a predetermined negative current in the inductor, and then turns off (920). Vsw may ring all the way to zero volt (930). Once Vsw reaches zero volt, the controller detects the ZVS valley and causes the low side switch to turn on (940).

It should be appreciated that the specific steps illustrated in FIG. 9 provide a particular method of operating a boost power converter circuit according to an embodiment of the disclosure. Other sequences of steps may also be performed according to alternative embodiments. For example, alternative embodiments of the disclosure may perform the steps outlined above in a different order. Moreover, the individual steps illustrated in FIG. 89 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, combination of the circuits and methods disclosed herein can be utilized to provide enhanced zero voltage switching in power converters. Although circuits and methods are described and illustrated herein with respect to several particular configuration of synchronous boost converter with enhanced zero voltage switching, embodiments of the disclosure are suitable for enhanced zero voltage switching in other power converter topologies such as, but not limited to, buck converters, as well as power converters utilizing silicon power switches, GaN power switches, or silicon carbide power switches.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A circuit comprising:

an input terminal and a ground terminal coupled to a power supply;

an output terminal and the ground terminal coupled to a load;

a low-side circuit comprising a low-side power switch coupled between a switch node and the ground terminal;

a high-side circuit comprising a high-side power switch coupled between the switch node and the output terminal;

an inductor coupled between the switch node and the input terminal; and a controller arranged to detect a valley of a voltage at the switch node;

wherein in response to detecting the valley, the low-side circuit transmits a signal to the high-side circuit;

wherein in response to receiving the signal, the high-side circuit turns on the high-side power switch for a time interval sufficient to generate a negative current in the inductor, and then turns off the high-side power switch causing the voltage at the switch node to transition to zero volts; and wherein the low-side circuit is arranged to turn on the low-side power switch in response to the voltage at the switch node at zero volts.

2. The circuit of claim 1, wherein the high-side circuit determines the time interval sufficient to generate a negative current in the inductor based on a duty cycle of a pulse width modulated (PWM) signal received from the controller, and a value of a resistor.

3. The circuit of claim 1, wherein the low-side circuit further comprises a first current sense device arranged to transmit a first signal including at least one of a magnitude and polarity of a first current through the low-side power switch, and a first driver circuit arranged to transmit a first control signal to the low-side power switch based at least in part on a voltage at the switch node and the first signal.

4. The circuit of claim 3, wherein the first driver circuit comprises a first threshold generation circuit.

5. The circuit of claim 1, wherein the low-side power switch is a gallium nitride (GaN) based switch.

6. The circuit of claim 1, wherein the high-side power switch is a gallium nitride (GaN) based switch.

7. A method of operating a circuit, the method comprising:

providing an input terminal and a ground terminal coupled to a power supply;

providing an output terminal and the ground terminal coupled to a load;

providing a low-side circuit comprising a low-side power switch coupled between a switch node and the ground terminal;

providing a high-side circuit comprising a high-side power switch coupled between the switch node and the output terminal;

providing an inductor coupled between the switch node and the input terminal;

detecting, by a controller, a valley of a voltage at the switch node;

transmitting a signal, by the low-side circuit, to the high-side circuit in response to the controller detecting the valley;

turning on, by the high-side circuit, the high-side power switch for a time interval sufficient to generate a negative current in the inductor in response to receiving the signal or in response to receiving the signal and a drain-to-source voltage of the high-side power switch going to zero;

turning off, by the high-side circuit, the high-side power switch causing the voltage at the switch node goes to zero volt; and turning on, by the low-side circuit, the low-side power switch in response to the voltage at the switch node being at zero volt.

8. The method of claim 7, wherein the high-side circuit determines the time interval sufficient to generate a negative current in the inductor based on a duty cycle of a pulse width modulated (PWM) signal received from the controller, and a value of a resistor.

9. The method of claim 7, wherein the low-side circuit further comprises a first current sense device arranged to transmit a first signal including at least one of a magnitude and polarity of a first current through the low-side power switch, and a first driver circuit arranged to transmit first control signals to the low-side power switch based at least in part on a voltage at the switch node and the first signal.

10. The method of claim 9, wherein the first driver circuit comprises a first threshold generation circuit.

11. A method of operating a circuit, the method comprising:

providing an input terminal and a ground terminal coupled to a power supply;

providing an output terminal and the ground terminal coupled to a load;

providing a low-side circuit comprising a low-side power switch coupled between a switch node and the ground terminal;

providing a high-side circuit comprising a high-side power switch coupled between the switch node and the output terminal;

providing an inductor coupled between the switch node and the input terminal;

detecting, by a controller, a valley of a voltage at the switch node;

transmitting a signal, by the low-side circuit, to the high-side circuit in response to the controller detecting the valley; and turning on, by the high-side circuit, the high-side power switch for a time interval sufficient to generate a negative current in the inductor in response to receiving the signal.

12. The method of claim 11, further comprising turning off, by the high-side circuit, the high-side power switch causing the voltage at the switch node goes to zero volt.

13. The method of claim 12, further comprising turning on, by the low-side circuit, the low-side power switch in response to the voltage at the switch node being at zero volt.

14. The method of claim 13, further comprising determining, by the high-side circuit, the time interval sufficient to generate a negative current in the inductor based on a duty cycle of a pulse width modulated (PWM) signal received from the controller and a value of a resistor.

15. The method of claim 14, wherein the low-side circuit comprises a first current sense device.

16. The method of claim 15, further comprising transmitting, by the first current sense device, a first signal including at least one of a magnitude and polarity of a first current through the low-side power switch, and a first driver circuit arranged to transmit first control signals to the low-side power switch based at least in part on a voltage at the switch node and the first signal.

17. The method of claim 16, wherein the low-side circuit further comprises a first driver circuit.

18. The method of claim 17, further comprising transmitting, by the first driver circuit, a first control signal to the low-side power switch based at least in part on a voltage at the switch node and the first signal.

19. The method of claim 11, wherein the low-side power switch is a gallium nitride (GaN) based switch.

20. The method of claim 11, wherein the high-side power switch is a gallium nitride (GaN) based switch.

* * * * *